United States Patent
Edmundsson et al.

(10) Patent No.: US 9,220,181 B2
(45) Date of Patent: Dec. 22, 2015

(54) ELECTRICAL ROOM OF AN INDUSTRIAL EQUIPMENT SUCH AS A CONTAINER CRANE, THE ELECTRICAL ROOM COMPRISING A COOLING DEVICE

(71) Applicant: ABB AB, Västerås (SE)

(72) Inventors: Bo Edmundsson, Willich (DE); Horst Schneider, Breitnau (DE)

(73) Assignee: ABB AB, Västerås (SE)

( * ) Notice: Subject to any disclaimer, the term of this patent is extended or adjusted under 35 U.S.C. 154(b) by 0 days.

(21) Appl. No.: 14/414,358

(22) PCT Filed: Jul. 3, 2013

(86) PCT No.: PCT/EP2013/064008
§ 371 (c)(1),
(2) Date: Jan. 12, 2015

(87) PCT Pub. No.: WO2014/009215
PCT Pub. Date: Jan. 16, 2014

(65) Prior Publication Data
US 2015/0216078 A1 Jul. 30, 2015

(30) Foreign Application Priority Data
Jul. 11, 2012 (EP) .................................. 12175933

(51) Int. Cl.
*H05K 7/20* (2006.01)
*B66C 13/52* (2006.01)
*H02G 3/03* (2006.01)

(52) U.S. Cl.
CPC ............ *H05K 7/20154* (2013.01); *B66C 13/52* (2013.01); *H02G 3/03* (2013.01);
(Continued)

(58) Field of Classification Search
CPC .................... B66C 13/52; H02G 3/03; H05K 7/206–7/20609
See application file for complete search history.

(56) References Cited

U.S. PATENT DOCUMENTS 4,126,232 A 11/1978 Orawiec
5,890,371 A 4/1999 Rajasubramanian et al.
(Continued)

FOREIGN PATENT DOCUMENTS

CN 201557355 U 8/2010
CN 102538535 A 7/2012
(Continued)

OTHER PUBLICATIONS

English machine language translation of Lee, Korean Patent KR 10-0835120 Bl, dated Jun. 5, 2008, Undated translation, 11 pages.*
(Continued)

*Primary Examiner* — Robert J Hoffberg
(74) *Attorney, Agent, or Firm* — Whitmyer IP Group LLC

(57) ABSTRACT

An electrical room housing electrical and electronic apparatus for operating and controlling electrical motors of an industrial equipment is disclosed. The electrical room includes a cooling device with a first heat exchanger which is arranged with a first set of channels through which is conducted a first flow of air drawn from inside the electrical room. Warm air from inside the electrical room is circulated through the first heat exchanger of the cooling device and returned to the electrical room in a closed loop, and the air temperature in the electrical room is controlled dependent on a setpoint of between 24-40° C. A method for controlling the cooling device to cool the electrical room and one or more computer programs arranged for controlling the cooling device are also described.

21 Claims, 5 Drawing Sheets

(52) U.S. Cl.
CPC ............ *H05K 7/206* (2013.01); *H05K 7/2059* (2013.01); *H05K 7/2069* (2013.01); *H05K 7/20209* (2013.01); *H05K 7/20309* (2013.01); *H05K 7/20327* (2013.01); *H05K 7/20609* (2013.01)

(56) References Cited

U.S. PATENT DOCUMENTS

| | | | |
|---|---|---|---|
| 6,742,583 B2 * | 6/2004 | Tikka ............................ | 165/291 |
| 6,789,612 B1 * | 9/2004 | Okamoto et al. ......... | 165/104.34 |
| 6,997,006 B2 * | 2/2006 | Kameyama et al. .......... | 62/259.2 |
| 7,100,682 B2 * | 9/2006 | Okamoto et al. ......... | 165/104.34 |
| 8,839,848 B2 * | 9/2014 | Wu et al. ....................... | 165/291 |
| 2002/0134544 A1 | 9/2002 | DeVilbiss et al. | |
| 2005/0201055 A1 | 9/2005 | Jyo et al. | |
| 2008/0173024 A1 | 7/2008 | Orlowski | |
| 2009/0139261 A1 * | 6/2009 | Nakano et al. .................. | 62/455 |
| 2011/0203770 A1 | 8/2011 | Rowe | |
| 2012/0181002 A1 * | 7/2012 | Chen et al. .................... | 165/121 |
| 2013/0278121 A1 * | 10/2013 | Shimada et al. .............. | 312/236 |

FOREIGN PATENT DOCUMENTS

| | | | |
|---|---|---|---|
| DE | 9109486 U1 | 9/1991 | |
| DE | 19921674 A1 | 11/1999 | |
| DE | 102008062430 A1 | 7/2010 | |
| GB | 2311168 A | 9/1997 | |
| JP | 2001358487 A | 12/2001 | |
| KR | 100835120 B1 | 6/2008 | |
| WO | WO 2009140899 A1 * | 11/2009 | ............... H05K 7/20 |

OTHER PUBLICATIONS

English translation of Applicant's response, dated Jul. 28, 2015, to Korean Intelluctual Property Office (KIPO) action, dated May 28, 2015, retrived from KIPO website, Undated translation, 8 pages.*
Directive 2005/32/EC of the European Parliament of Jul. 6, 2005 established; 30 pages.
European Search Report, Application No. EP 12 17 5933, Completed: Jan. 14, 2013, 6 pages.
International Search Report and Written Opinion of the International Searching Authority, Application No. PCT/EP2013/064008, Completed: Sep. 10, 2013; Mailing Date: Sep. 20, 2013, 10 pages.
The Korean Intellectual Property Office—Notice of Grounds for Rejection, Application No. 2015-7000642, Issued: May 28, 2015, 4 pages.

* cited by examiner

ELECTRICAL ROOM OF AN INDUSTRIAL EQUIPMENT SUCH AS A CONTAINER CRANE, THE ELECTRICAL ROOM COMPRISING A COOLING DEVICE

An electrical room of an industrial equipment such as a container crane, the electrical room comprising a cooling device.

TECHNICAL FIELD

The invention relates to an electrical room arranged with a cooling device for cooling electrical and electronic equipment for operating and controlling electrical loads such as electric motors of an industrial equipment or plant. In particular it is advantageously used to cool an electrical room of a crane, such as a container crane.

TECHNICAL BACKGROUND

Container cranes are used to handle freight containers and especially to transfer containers between transport modes at container terminals, freight harbours and the like. Standard shipping containers are used to transport a great and growing volume of freight around the world. Transshipment is a critical function in freight handling. Transshipment may occur at each point of transfer and there is usually a tremendous number of containers that must be unloaded, transferred to a temporary stack, and later loaded on to another ship, back onto the same ship or loaded instead onto another form of transport. Loading and unloading containers to and from a ship takes a great deal of time. The development of automated cranes has improved loading and unloading and made the productivity more predictable, and also eliminated many situations in which port workers have been exposed to danger and injury. Loading and unloading is seen as a bottleneck in terms of freight handling as the ships are idle in port while loading/unloading takes place. To reduce this idle time and container cranes are normally run continuously on long shifts until the loading or unloading of each ship is completed.

A container crane uses a number of powerful electric motors to power the moving parts and wind in or let out the wire ropes or cables used to lift a spreader holding a container up or down. Electric motors are used to power the movements of a trolley holding the spreader to lift and transport the containers out of the ship and onto a truck etc. on land, or vice versa if loading. Electrical power and control devices for operating the electrical motors of the crane, devices such as power converters, inverters, rectifiers, transformers and so on are placed in an electrical room. In use the electrical and electronic devices such as inverters, rectifiers and transformers develop significant quantities of heat as a consequence of electrical losses. For example, during normal operation in a crane electrical room the electrical and electronic apparatus generates from 1-30 kW per hour. This heat has to be removed from the electrical room to prevent equipment from running at too high a temperature and overheating. In electrical rooms for industrial plant and equipment generally it is common practice to cool the electrical rooms using a water supply in a heat exchanger to cool warm air from the electrical and electronic control and operating devices. This advantageous when there is a plentiful supply of clean and filtered fresh water. However, the electrical rooms for cranes and container cranes are usually cooled by air conditioners.

FIG. 5 (Prior Art) shows schematically a known type of cooling device for an electrical room, often called a split air conditioner. The figure shows an electrical room 15' of a container crane which includes electrical and power electronic devices 16 which may be arranged with one or more local cooling fans 17. An inside air conditioner 21 including for example, one or more evaporator coils, is shown in the upper part of the room. The inside air conditioner is connected to an outside air conditioner 22, comprising for example, one or more condenser coils. Traditional cooling in this type of crane electrical room is carried out as follows. Outside air enters the electrical room through one or more lower inlets 12'. Warm air W generated by the thermal losses of the electrical and power electronic devices 16 rises, assisted by a fan included as part of the inside air conditioner 21. The warm air W is cooled by contact with evaporator coils or similar in an intake part of the inside air conditioner 21. The refrigerant or heat transfer fluid in the coils is circulated by pumps and/or compressors in the outside air conditioner 22. Heat extracted from the warm air in the electrical room is transferred to the outside air conditioner 22, also sometimes called an outdoor condenser unit, which transfers that heat further to the surrounding outside air. Some warm air may exit from the electrical room through upper ventilation openings 13. Cooler air C from an outlet part of the inside air conditioner 21 falls towards the floor of the electrical room 15'. In such a traditional cooling set-up the electrical room is commonly run with an inside temperature setpoint of 24° C. and it cools an average energy loss input of some 12.5 kW per hour using a power consumption of around 4.5-5.0 kW per hour.

The use of split air conditioners has several disadvantages. They are relatively inefficient, in part because the temperature differential between an inside temperature of 24° C. compared to an outside temperature may be small. In addition, most inside air conditioners tend to disrupt the natural convection flow of warm air rising to the ceiling then falling to the floor. This is because the inside air conditioner is positioned in the stream of warm air under the ceiling but direction of flow of cooled air pushed back by the inside air conditioner into the room is usually non-optimal and disturbs the natural convection flow. This is indicated schematically in FIG. 5 (Prior Art) as turbulent flow $W_t$ in the warm air around the inside air conditioner. Perhaps as a consequence of the above inefficiencies, split air conditioners in any case tend to be run continuously at a higher speed, at least during daylight hours, in order to remove the heat generated by thermal losses in the electronic and electrical equipment, inverters, transformers, rectifiers and so on. The known indoor air conditioners and outside condenser units or outside air conditioners also consume a relatively great amount of electricity to cool the room. Standards introduced in recent years such as the Directive 2005/32/EC of the European Parliament of 6 Jul. 2005 established a framework for the setting of ecological design requirements for energy-using products. Such high levels of energy consumption are also in conflict with the intentions of other standards such as DIN 16001, a Management Standard for Energy Efficiency, and ISO 50001.

The inventors have noted that in the container crane industry, running split air conditioners at high loads continuously tends to result in a short service life of less than five years. In addition, continuous high loading results in unexpected breakdowns, which may disrupt production. The inventors therefore have endeavoured to provide an improved cooling device for electrical rooms in container cranes and other industrial applications with a similar service requirement. In addition, the common use of open loop air circulation introduces contaminants such as dirt, soot particles, pollen and moisture into the electrical room which can be deposited on surfaces of the electrical and electronic equipment. This causes a requirement for periodic maintenance and cleaning to avoid breakdown of insulating surfaces and burning of switch contact surfaces. As well, the moisture, soot and dirt particles are drawn into the indoor air conditioner by the fan which also leads to a reduction in thermal efficiency, leading in turn to overloading of the components of a split air conditioner.

SUMMARY OF THE INVENTION

The aim of the present invention is to provide an electrical room with an improved cooling device that solves some of the above problems. Advantageous embodiments are described in sub-claims to the independent claims.

In a first aspect of the invention an electrical room comprising a device for cooling the electrical room is described, the electrical room housing electrical and electronic apparatus for operating and controlling electric motors of a industrial equipment, the cooling device comprising a heat exchanger for cooling air in the electrical room which is operated dependent on at least one temperature measurement, wherein a first heat exchanger is arranged with a first set of channels through which is conducted a first flow of air drawn or conducted from inside the electrical room, and wherein the air from inside the electrical room is circulated through the cooling device of the first heat exchanger and returned to inside the electrical room in closed loop and wherein the air temperature is controlled dependent on a setpoint for a temperature measurement inside the electrical room of between 24-40° C.

According to an embodiment of the invention, an electrical room comprising a device for cooling the electrical room is described, the electrical room housing electrical and electronic apparatus for operating and controlling electric motors of a industrial equipment, the cooling device comprising at least one heat exchanger for cooling air in the electrical room which is operated dependent on at least one temperature measurement, which first heat exchanger is arranged with a first set of channels through which is conducted a first flow of air drawn or conducted from inside the electrical room, wherein the first heat exchanger is an air-to-air heat exchanger arranged with a second set of channels, which second channels are in thermal contact with the first set of channels arranged in the air-to-air heat exchanger, through which channels is conducted a second flow of air drawn from outside the electrical room.

According to another embodiment of the invention, an electrical room comprising a device for cooling the electrical room is described, the electrical room housing electrical and electronic apparatus for operating and controlling electric motors of a industrial equipment, the cooling device comprising at least one heat exchanger for cooling air in the electrical room which is operated dependent on at least one temperature measurement, which first heat exchanger is arranged with a first set of channels through which is conducted a first flow of air drawn or conducted from inside the electrical room, wherein the cooling device is arranged with at least one second heat exchanger positioned in the flow of air from inside the electrical room, the at least one second heat exchanger being connected to at least one third heat exchanger arranged outside of the electrical room.

According to another embodiment of the invention, an electrical room comprising a device for cooling the electrical room is described, the electrical room housing electrical and electronic apparatus for operating and controlling electric motors of a industrial equipment, the cooling device comprising at least one heat exchanger for cooling air in the electrical room which is operated dependent on at least one temperature measurement, which first heat exchanger is arranged with a first set of channels through which is conducted a first flow of air drawn or conducted from inside the electrical room, wherein the at least one second heat exchanger comprises two or more evaporator coils each containing a heat transfer fluid and each connected to one of the at least one third heat exchangers. In this way equipment redundancy is provided for the second heat exchanger circuit as in normal service only one second heat exchanger circuit is needed at a time.

According to another embodiment of the invention, an electrical room comprising a device for cooling the electrical room is described, the electrical room housing electrical and electronic apparatus for operating and controlling electric motors of a industrial equipment, the cooling device comprising at least one heat exchanger for cooling air in the electrical room which is operated dependent on at least one temperature measurement, which first heat exchanger is arranged with a first set of channels through which is conducted a first flow of air drawn or conducted from inside the electrical room, wherein two or more evaporator coils comprised in the at least one second heat exchanger are each connected to one of two or more third heat exchangers which are arranged with control switches such that only a selected one of the two or more evaporator coils is cooled. In this way the service load of running one single second heat exchanger is divided between two or more second heat exchanger circuits.

According to another embodiment of the invention, an electrical room comprising a device for cooling the electrical room is described, the electrical room housing electrical and electronic apparatus for operating and controlling electric motors of a industrial equipment, the cooling device comprising at least one heat exchanger for cooling air in the electrical room which is operated dependent on at least one temperature measurement, which first heat exchanger is arranged with a first set of channels through which is conducted a first flow of air drawn or conducted from inside the electrical room, wherein the first channels and the second channels in the first heat exchanger are arranged such that the first flow of air in the first channels flow in the first heat exchanger is conducted in a direction counter to the direction of the second flow of air in the second channels. The first heat exchanger circuit with a cross-flow of warm inside air flowing in a direction counter to cooler air from outside provides effective cooling with only a low energy input for driving fans.

According to another embodiment of the invention, an electrical room comprising a device for cooling the electrical room is described, the electrical room housing electrical and electronic apparatus for operating and controlling electric motors of a industrial equipment, the cooling device comprising at least one heat exchanger for cooling air in the electrical room which is operated dependent on at least one temperature measurement, which first heat exchanger is arranged with a first set of channels through which is conducted a first flow of air drawn or conducted from inside the electrical room, wherein the cooling device is arranged connected with an insulated air collecting space into which the air from the electrical room is conducted after cooling. The air space under the floor forms a cold reservoir which makes for stable running conditions for the heat exchanger equipment when minor thermal load fluctuations would otherwise cause temporary temperature surges in the room.

According to another embodiment of the invention, an electrical room comprising a device for cooling the electrical room is described, the electrical room housing electrical and electronic apparatus for operating and controlling electric motors of a industrial equipment, the cooling device comprising at least one heat exchanger for cooling air in the electrical room which is operated dependent on at least one temperature measurement, which first heat exchanger is arranged with a first set of channels through which is conducted a first flow of air drawn or conducted from inside the electrical room, wherein the cooling device is arranged with two or more air pressurising devices for conducting the first flow of air and the second flow of air into contact with the first heat exchanger or air-to-air heat exchanger. The air pressurising devices circulate air past the first and second heat exchanger components but consume relatively little electrical energy.

According to another embodiment of the invention, an electrical room comprising a device for cooling the electrical room is described, the electrical room housing electrical and electronic apparatus for operating and controlling electric motors of a industrial equipment, the cooling device comprising at least one heat exchanger for cooling air in the electrical room which is operated dependent on at least one temperature measurement, which first heat exchanger is arranged with a first set of channels through which is conducted a first flow of air drawn or conducted from inside the electrical room, wherein the cooling device is arranged with control switches for controlling at least the two or more air pressurising devices and the at least one third heat exchanger (22) arranged controlled dependent on a setpoint of between 35-40° C. for a temperature measurement in the electrical room.

The inventors have noted that the electrical and electronic apparatus, power converters, inverters, rectifiers, transformers and so on are normally specified for continuous service use at temperatures up to 40 or in some case 45° C. By running the electrical room controlled to an air temperature of around 35° C., or up to around 38° C. under the ceiling, the inventive cooling device is more efficient. This is because there is a greater temperature differential between the 38° C. inside temperature and the temperature of the surrounding air outside the electrical room than with the prior art setpoint of 24° C. in the electrical room. In this way, by increasing the service temperature, the inventors have provided an improved cooling device which is more thermodynamically efficient.

In a preferred embodiment of the first aspect of the invention the first heat exchanger is an air-to-air heat exchanger arranged with a first set of channels through which is conducted a first flow of air drawn or conducted from inside the electrical room, which first channels are in thermal contact with a second set of channels arranged in the heat exchanger, through which is conducted a second flow of air drawn or conducted from outside the electrical room, wherein the air from the electrical room is circulated through the cooling device and returned to the electrical room in a closed loop.

In the preferred cooling device an air-to-air heat exchanger is used as the primary cooling device to extract heat from the warm air in the electrical room and transfer it to the surrounding air outside of the electrical room. Cooler air from outside the electrical room is drawn by a fan through the second set of channels in the second side of the air-to-air heat exchanger. Warm air from inside the electrical room is drawn or conducted by a fan through channels in the first side of the air-to-air heat exchanger. These first channels are in thermal contact with the second channels of the air-to-air heat exchanger through which cooler air is drawn or conducted with the aid of a fan.

The warm air from inside the electrical room, after cooling, is returned to the electrical room in a closed cycle. This type of air-to-air heat exchanger device, also called a recuperator, has been used in building ventilation systems in Sweden. It has been used to recover heat from ventilation outflows, which heat is then applied to warm a cold inflow of replacement ventilation air, thus saving some energy by warming the incoming air. There are different designs for arranging the recuperators as cross flow or counter flow air-to-air heat exchangers. As well there are different designs for air-to-air heat exchangers, including those such as cellular type, flat plate, and shell-and-tube. A great advantage of an air-to-air heat exchanger device is that the only electrical power needed for the primary cooling function is that which is used to drive the two fans that conduct the two air flows through each side of the air-to-air heat exchanger. In a prototype built and arranged to cool a thermal loss of 15 kW two fans are used that consume only 300-400 W each, which is a significant reduction from the power used by an indoor air conditioner and an outdoor air conditioner which consume in total around 4.5 to 5 kW to cool the same thermal energy input.

A secondary cooling capacity is arranged in the form of at least one evaporator coil mounted in the first air flow of warm air from inside the electrical room and preferably after the first heat exchanger or air-to-air heat exchanger. The evaporator coil is connected to an outside air conditioner mounted outside of the electrical room. A heat transfer fluid in the evaporator coil absorbs heat as it turns into a gas and releases heat in the condenser unit or outside air conditioner as it returns to a liquid state in a condenser coil, in the normal way that air conditioners work. The evaporator coil provides a secondary cooling circuit and secondary cooling effect which may be switched on as measured temperatures rise above one or more setpoints. In this way, the cooling effect is regulated according to cooling demand, and the secondary cooling circuit and in particular the outside air conditioner necessary for the secondary cooling capacity, is not operated more often than is necessary, nor is it run for a longer time than necessary.

Preferably at least two separately controllable evaporator coils are used, each connected to a separate outside air conditioner. By means of manual switching or thermostat regulation, or an automated control program, the separate evaporator coils are selected and operated to ensure that when secondary cooling by one single evaporator coil is required, that if the single coil is switched off for a period of time that, when one single coil is subsequently required, then a different coil is subsequently selected and operated. In other words, that use of a single secondary evaporator coil is distributed alternately between two or more coils. This improvement shares the load evenly between the two outside air conditioners and provides a longer service life, with much less exposure to breakdowns than are experienced when running outside air conditioners at full load and for extended periods.

As the first cooling flow for the inside air through the air-to-air heat exchanger is carried out in a closed loop, humidity or pollen, and dirt, smoke, grease or other pollutants from the external surroundings are not introduced into the electrical room. The air is thus kept clean and the electrical/electronic equipment and switchgear are not exposed to contaminants. Thus the maintenance requirement for inspecting and cleaning the electrical and electronic equipment in the electrical room is largely eliminated. Similarly, dirt or other contaminants do not build up on the evaporator coil or in the first set of air channels in the air-to-air heat exchanger and reduce thermal efficiency.

The second cooling flow is drawn in from surrounding air outside the electrical room and through the air-to-air heat exchanger in thermal contact with the first set of channels in the air-to-air heat exchanger through which the warm air is drawn. The inflow of cooler air from outside is filtered to prevent contaminants from entering the second set of channels in the air-to-air heat exchanger which would otherwise reduce its efficiency by allowing a build-up of dirt, grease or other pollutants etc. Maintenance on the open loop, cooling flow side of the first heat exchanger, or air-to-air heat exchanger, is limited then to inspecting and cleaning and/or changing the air filter at regular intervals.

The electrical room is preferably built from a standard freight container, such as a 20 foot or 40 foot shipping container. This provides an effective and weather-tight room or shelter for the equipment and it is relatively inexpensive as a functional structure. In addition, the metal roof provides a roof area that is suitable for providing a useful degree of passive cooling by means of radiation and conduction from the metal roof to the outside air. Preferably the electrical room is arranged elevated above ground level, for example in the structure of a crane. This location provides better cooling from air movement, wind etc.

According to a second aspect of the invention, a method is described for cooling an electrical room housing electrical and electronic apparatus for operating and controlling electric motors of an industrial equipment, the electrical room comprising a cooling device for cooling the electrical room, the cooling device comprising a heat exchanger for cooling air in the electrical room, wherein the cooling device comprises a first heat exchanger which is arranged with a first set of channels and by conducting a first flow of air from inside the electrical room through the first heat exchanger and returning it to the electrical room in a closed loop, and by controlling the air temperature in the electrical room dependent on a setpoint of between 24-40° C. for at least one temperature measurement inside the electrical room.

Controlling the temperature in the electrical room to a higher setpoint than with traditional cooling methods and equipment results in a more efficient use of heat exchangers. In the preferred embodiment, the use of an air-to-air heat exchanger in the cooling device provides a primary cooling function which also has a comparatively low energy use. The inventors have determined through work with testing of prototypes and use of metrological data for several ports that in the European port of Rotterdam for example, the air-to-air heat exchanger together with passive cooling from the electrical room outer surface can cool the electrical room without any further cooling effect for several months of the year. For example at midday in Rotterdam no further cooling effect is required during the 6 months of the year from November to April. During warmer weather in Rotterdam running one single outside air conditioner, or outside condensing unit, covers the rest of cooling capacity needed. This is, as an example, for a cooling capacity to cool an average energy output from the inverters, rectifiers etc. in the electrical room of around 15 kW/hr. In terms of Rotterdam temperatures at least the second outside air conditioner or outside condensing unit can additionally increase the redundancy to more than double the available cooling capacity compared that which is needed to cool the electrical room.

When used in other geographical locations with higher outside air temperatures the dimensioning and or design of the first heat exchanger—preferably an air-to-air heat exchanger, and dimensioning and/or number of parts of the secondary cooling circuit including the second heat exchanger and the outside air conditioner may be adjusted or increased to provide a greater margin of cooling effect under hotter climate conditions.

In another aspect of the present invention, an computer program is provided, which computer program is arranged to, when loaded into a processor of a computer or controller, cause the computer or controller to carry out a method of cooling an electrical room by operating a cooling device comprising at least one an air-to-air heat exchanger operating to cool air drawn from the electrical room in a closed cycle and dependent on at least one temperature measurement.

In another aspect of the present invention, an computer program product is provided, and a non-transitory, computer readable medium having a program recorded thereon, which computer program is arranged to, when loaded into a processor of a computer or controller, cause the computer or controller to carry out a method of cooling an electrical room by operating a cooling device comprising at least one an air-to-air heat exchanger operating to cool air drawn from the electrical room in a closed cycle and dependent on at least one temperature measurement.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

BRIEF DESCRIPTION OF THE DRAWINGS

A more complete understanding of the method and system of the present invention may be had by reference to the following detailed description when taken in conjunction with the accompanying drawings wherein.

DESCRIPTION OF THE PREFERRED EMBODIMENTS

Figure 1:
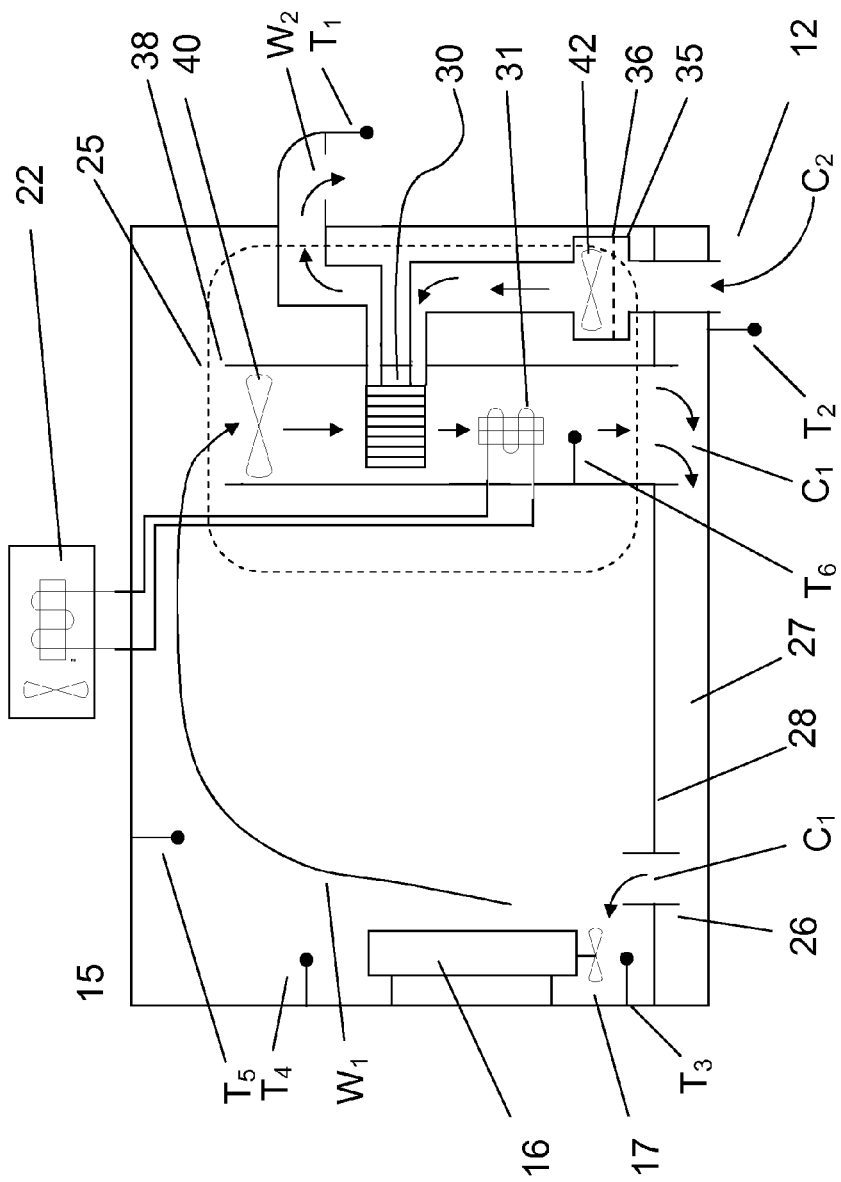
FIG. 1 shows in a simplified schematic diagram a cooling device for cooling an electrical room housing electrical and electronic apparatus for operating and controlling electrical motors of a industrial equipment according to an embodiment of a first aspect of the invention.

FIG. 1 shows a simplified diagram of a an electrical room including a cooling device. In this exemplary example an electrical room for a container crane is described. The electrical room with the cooling device may also be applied to other types of crane or heavy lifting equipment. In addition, the electrical room could be an electrical room for operating and controlling electrical motors in any type of industrial process, such as electrical power generation, transmission and distribution processes as well as water purification and distribution processes, oil and gas production and distribution processes, petrochemical, chemical, pharmaceutical and food processes, and pulp and paper production processes. These are just some examples of processes where the device can be applied. There exist countless other industrial processes. The process may also be other types of industrial processes such as the manufacturing of goods. The electrical room may for example be constructed to operate and control electric motors such as electric propulsion and/or steering motors installed in ship, such as a passenger liner or a ship used in the oil & gas industry.

Figure 2:
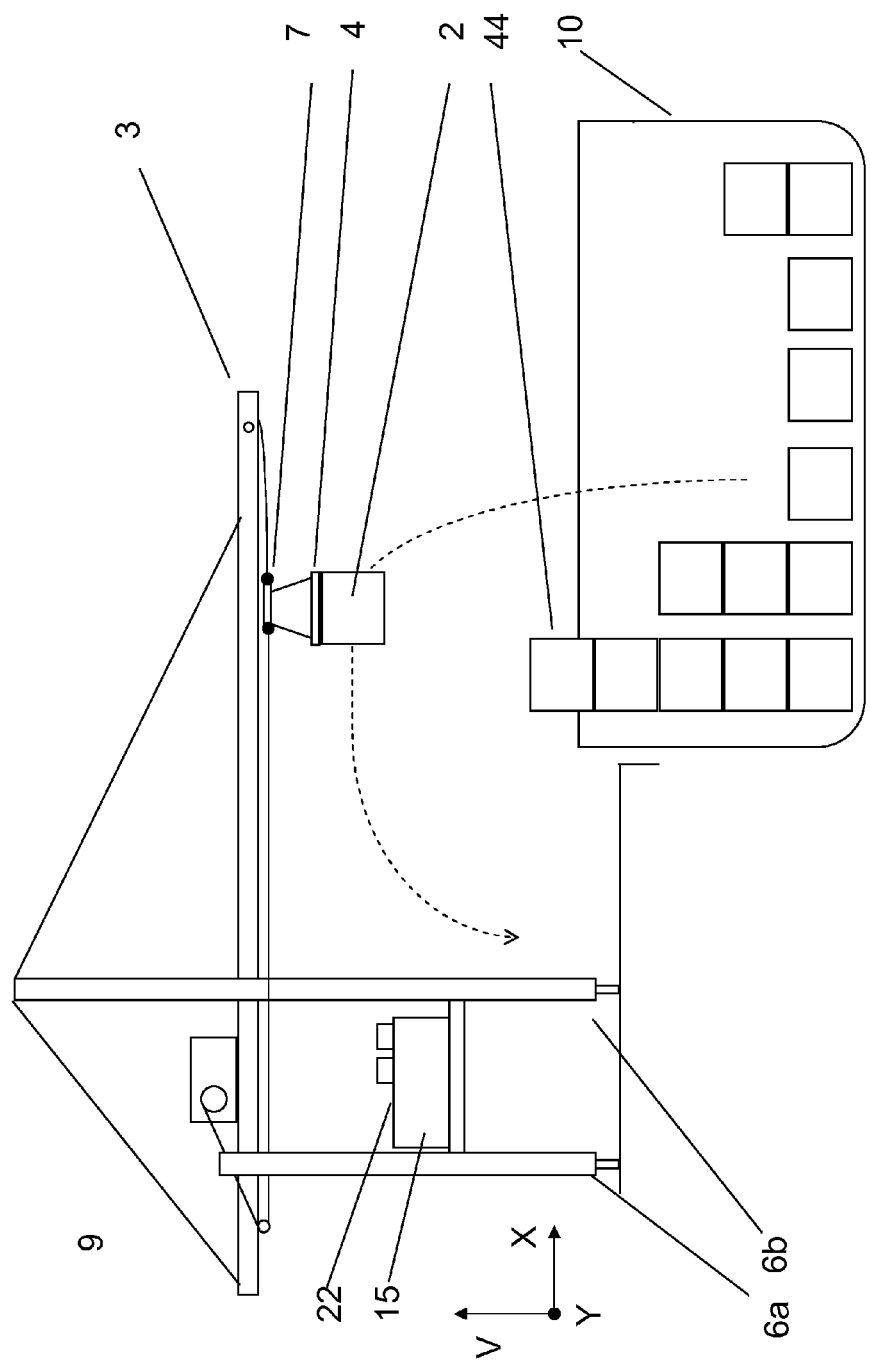
FIG. 2 show a simplified diagram of a container crane incorporating the electrical room and cooling device invention of FIG. 1.

In FIG. 2 a simplified schematic diagram of a container crane of the ship-to-shore (STS) type is shown. The figure shows a container crane 9 and a container ship 10. The container crane 9 has a support structure including supporting legs 6a, 6b, which may have wheels that are run on rails. The crane has a boom 3, a trolley 7 and a spreader 4 which carries the weight of a container 2.

In FIG. 2 the crane is shown to have a gantry or boom under which a trolley 7 runs forward and back in the X direction. This direction is also known as the gantry direction. The trolley 7 supports a spreader 4 which holds, lifts and/or lowers a container 2 by means of one of more electric motors mounted on the spreader 4. The crane lifts the container 2, for example, out of the ship 10 and along a path to be set down on a container, or a landing place such as a ground slot, or onto a truck or other vehicle (not shown). The crane 9 runs on rails under each set of legs 6a, 6b in a direction in or out of the plane of the paper, indicated as a Y direction. This direction is also known as the trolley direction. The powerful electric motors of the crane that drive the movements of the spreader 4 and trolley 7 are operated and controlled by electrical and electronic equipment such as inverters, converters, rectifiers, transformers and other low-to-medium voltage equipment.

The electrical and electronic control equipment is arranged installed in an electrical room 15. The electrical room is advantageously mounted higher than ground level and may be attached to the structure of the crane. When constructed from a container the electrical room includes a metal roof. The metal roof area provides passive cooling by means of radiation and conduction to the outside air. When mounted above ground level the electrical room is usually more exposed to wind and air cooling. Air quality above ground level is often superior with a lower concentration of grease, dirt, soot and other pollutants in the air from eg freight handling trucks, mobile cranes, trains and other pollution sources in a port, harbour or container yard.

FIG. 1 shows an electrical room 15 including a cooling device 25, indicated surrounded by a dashed line ( - - - ). The diagram shows electrical and power electronic devices 16 which may be arranged with one or more local cooling fans 17. The figure shows that the cooling device 25 comprises a first heat exchanger (30), which is arranged with a first set of channels (not shown) through which is conducted a first flow of warm air $W_1$ drawn from inside the electrical room. The warm air ($W_1$) from inside the electrical room, shown as an arrow→rising from around the electrical and power electronic devices 16, is circulated through the first set of channels of the first heat exchanger (30) and returned ($C_1$) to the electrical room in a closed loop via air space 27 and outlet 26.

The cooling device 25 comprises the following. A fan 40 is arranged mounted in an enclosure 38 which contains a first heat exchanger 30, preferably an air-to-air heat exchanger, and at least one evaporator coil 31. The enclosure 38 is connected to an air space 27 under the floor 28. A ventilation outlet 26 from air space 27 is placed relatively close to the electrical and power electronic devices 16. Fan 40 provides a first air flow which draws or conducts warm air $W_1$ down from the upper part of the room under the ceiling and into the enclosure with the air-to-air heat exchanger 30. The warm air $W_1$ is passed through the first set of channels (not shown) which are in thermal contact with the second set of channels arranged in the first heat exchanger 30, preferably of the air-to-air type. A number of temperature sensors $T_1$-$T_6$ are placed in different parts of the room. These are preferably of the PT 100 type but any suitable air temperature sensor may be used.

A second flow of air $C_2$ is drawn or conducted from the surrounding air outside the electrical room into a second enclosure 35. Enclosure 35 includes an inlet 12, a filter 36 at the end nearest the inlet 12, a fan 42 close to the inlet but preferably after the filter 36, and an inlet into the second set of channels (not shown) which are in thermal contact with the first set of channels in the heat exchanger 30. An outlet from the second set of channels in the heat exchanger 30 leads the warm outlet air $W_2$ to a duct for release into the surroundings outside the electrical room. Filter 36 is preferably an industrial filter, for example a filter of Class G4 and arranged with filter material made from a fabric, eg polyester fabric in the form of multiple bags supported in a frame. The filter 36 is preferably arranged with a filter control unit that uses a sensor to detect when the filter has changed in characteristics or become loaded with too much dust and dirt and requires changing.

The primary cooling circuit runs as follows. Warm air $W_1$ generated by the thermal losses of the electrical and power electronic devices 16 rises to the ceiling, and is drawn down into an enclosure 38 by fan 40. The air is conducted through the first set of channels in the heat exchanger 30, preferably an air-to-air heat exchanger, which are in thermal contact with the second set of channels through which cooling air is circulated by the second fan 42. The air-to-air heat exchanger 30 is preferably of the counter-flow heat exchanger type in which the flow through the first set of channels is not aligned in the same direction as the flow through the second set of channels. Advantageously the two flows are arranged at 90° to each other or at 180°.

The warm air $W_1$ from inside the electrical room is returned to the electrical room after cooling $C_1$ and passes through an air space 27 under the floor 28. The air space 27 for collecting the cooled air is preferably thermally insulated by the double floor from the air in the electrical room, and it is also preferably at a slight overpressure compared to the air in the electrical room. In operation air space 27 forms a cold reservoir which enables for stable running conditions for the heat exchanger equipment during load fluctuations which would otherwise cause temporary temperature surges in the room. The cooled air $C_1$ then circulates back into the electrical room through outlet 26. The outlet 26 is located such that the cooled air is directed towards the electric and electronic components 16. The air temperature in the room measured and the air temperature in the electrical room is controlled dependent on a setpoint of between 24-40° C. for at least one temperature measurement inside the electrical room.

The air in the electrical room is cooled in a closed loop. This has the advantage of continuously transferring heat from the warm air $W_1$ in the electrical room to the outside surroundings and, as no significant amount of new air is drawn into the room, then there is no heat added from any incoming air. Neither is any humidity added, nor are there any pollutants in the form of dust, dirt, smoke, grease or other substances entering the room, which avoids contamination of insulation surfaces or contact surfaces in the electric and electronic equipment 16.

The above example is based on an average 15 kW heat energy input to the electrical room. The first air flows $W_1$, $C_1$ previously described make full use of the natural convection flow inside the electrical room. The natural convection flow of warm air from the electrical and electronic devices 16 flows up towards the ceiling and is conducted or drawn down by fan 40 into contact with the colder surfaces of the first heat exchanger 30, and second heat exchanger 31. The cooled air in the air space 27 of the electrical room is also kept thermally insulated by the double floor from the warmer air. This makes optimal use of convection flows to transfer heat energy towards the first 30 and second heat exchangers 31, adding to the efficiency. When the electrical room is cooled so that a maximum room temperature of 35° C., measured at $T_4$ above the electrical and electronic equipment 16, the air temperature under the ceiling measured at $T_5$ may be up to 38° C. This relatively high temperature also provides an improved temperature differential between the roof of the electrical room and the outside air which promotes passive cooling by radiation and conduction/convection from the roof.

When an increased cooling effect is required a secondary cooling circuit is operated. In FIG. 1 a second heat exchanger 31 is also arranged in the first flow of warm air $W_1$ from inside the electrical room. The second heat exchanger 31 is preferably an evaporator coil which is connected to an outside air conditioner 22 mounted outside the electrical room. The outside air conditioner 22 may also be seen in FIG. 2 mounted on the outside of the electrical room 15. When increased cooling effect is required the outside air conditioner 22, also called an outside condenser unit, is switched on and it operates in the normal way. It pumps heat transfer fluid or refrigerant fluid in gaseous form from the evaporator coil in the second heat exchanger 31 to a condenser coil inside the outside air conditioner 22, where evaporated fluid from the evaporator coil is condensed and returned as cooled, condensed heat transfer fluid to the evaporator coil in the second heat exchanger 31. Heat transfer fluid such as fluid types R134a, 407C and 410A may be used. A temperature sensor $T_6$ may be placed near to the evaporator coil(s) of the second heat exchanger 31.

In a preferred embodiment at least two evaporator coils are arranged as heat exchangers 31 in the first flow of warm air $W_1$ from the electrical room, and each connected to an outside air conditioner 22. In the first place this confers an equipment redundancy in case that one of the two outside air conditioners 22 should unexpectedly fail. The outside air conditioners 22 may also be seen in FIG. 2 mounted on the outside of the electrical room 15. Secondly it confers a longer service life on the heat exchangers 31 and outside air conditioners 22 when using two secondary cooling circuits and when combined with intelligent load sharing. By manual switching, or using a setup with thermostats, or by using a control application or by another method each of the two secondary cooling circuits are switched on alternately when only one evaporator coil, one secondary cooling circuit, is required. That is to say that when cooling is required from only one evaporator coil, then each one of the two or more outside air conditioners 22 is switched on in turn when the single coil cooling is needed so that the length of time that each coil is in use is evenly distributed across the two or more secondary cooling circuits each comprising at least one evaporator coil 31, and at least one outside condenser unit or outside air conditioner 22. The result of this is that each outside condensing unit or outside air conditioner 22 is run for about the same length of time with the same load thus increasing service life and making the occurrence of unexpected air conditioner failure extremely unlikely.

Figure 3:
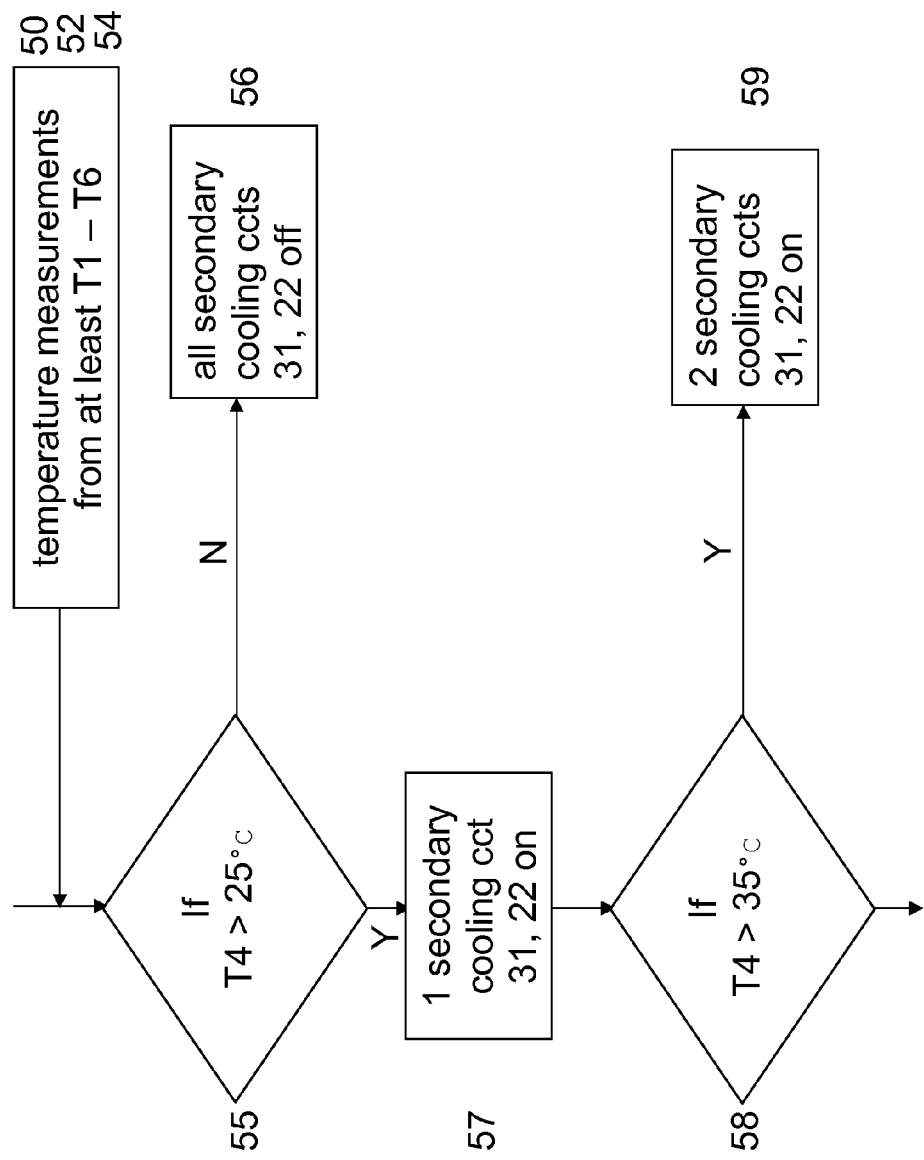
FIG. 3 shows in another aspect of the electrical room and cooling device invention of FIG. 1 a flowchart for a method of operating the electrical room comprising the cooling device and housing electrical and electronic apparatus for operating and controlling electrical motors of a industrial equipment.

FIG. 3 shows a flowchart for a method of controlling the cooling effect dependent on measurements of one or more air temperatures in the electrical room, such measurements sampled from sensors $T_1$-$T_6$. The figure shows a number of steps:

50 Receive temperature measurements from at least sensors $T_1$-$T_6$

52 Determine outside temperature $T_2$

54 Determine an inside temperature, from at least $T_4$

55 If $T_4$

57—is greater than the first setpoint, eg 25° C., then switch on a first secondary cooling circuit;

58 If $T_4$

59—is greater than the second setpoint, eg 35° C., then switch on a second secondary cooling circuit, so that two or more secondary cooling circuits (ccts) are on.

The basic elements are that the primary cooling circuit is switched on, two fans 40, 42 are in motion, and that one (57) or two (59) secondary cooling circuits are available and may be switched on if a measured temperature rises above one or more set points.

In step 57, when one secondary cooling circuit comprising an evaporator coil or second heat exchanger 31 and an outside air conditioner 22 or outside condenser is switched on, this is done in a selective way. An operator, or preferably a part of an automatic control application or system, keeps track of which single evaporator coil was last used on its own. With this information available, when operation of a single second heat exchanger is next required, then the single evaporator that was not last used on its own is switched on. Thus the single evaporator coil load is switched alternately between the two evaporator coils of the second heat exchanger circuits.

In addition to that further successive stages of increased or decreased cooling effect may be selected by changing a fan speed on either or both the primary cooling circuit fans 40, 42. In practice this would mean additional method steps between steps 50-57 to add (or reduce) cooling effect in lesser stages. For the secondary cooling circuits additional adjustments are also possible. As well variable fan speeds on the one, or preferably two outside condenser units, or outside air conditioner units 22 may similarly be increased from lower speed to higher speed in a gradual or step fashion to provide greater cooling effect if and when required, depending on setpoints and measured temperatures. With some outside air conditioner units there may be more than one compressor/condenser speed available for selection which may also be incorporated as an action to increase or reduce cooling effect as and when required.

In the primary air cooling circuit, preferably comprising the first air-to-air heat exchanger 30, industrial variable-speed impeller fans may be used to draw or conduct air past the heat exchangers. However, other devices for pressurizing or moving or conducting air may be substituted for one or more of the fans 40, 42 such as a suitably arranged air pump, piston pump, turbine, bellows and so on.

In principle the cooling device 25 for cooling the electrical room 15 may be controlled by one or more thermostats together with manual intervention. The cooling device may also be controlled by an automated process running in a controller or a processor of a computer. In a preferred embodiment the cooling device is controlled by a program or computer application that is also connected to an industrial control system such as the 800xA system supplied by ABB. In this case supervision and reporting on the cooling device is enabled, which facilitates compliance with the requirements of ISO 50000 in respect of Reporting on Efficiency of the System. In addition automated control may be further developed. For example, when the industrial control system has information that the container crane (or other industrial equipment that the electrical room is a part of) shall run under a heavy load within the next few minutes, then a signal may be sent to the cooling system to start extra cooling in advance and before any temperatures have increased. In this way it is possible to smooth out abrupt increases in cooling demand, saving some electric power and also reducing the extent of fast-changing temperature loads on the cooling equipment during periods that include both high load and less high load.

During a maintenance or inspection visit to the electrical room the maximum temperature setpoint measured at $T_4$ may be reduced temporarily to around 22-24° C. In this way the air in the room is temporarily maintained at a reasonably comfortable temperature for engineers or technicians to work in the electrical room when, for example, changing the air filters.

In another embodiment of the invention the first heat exchanger 30 may be water cooled. The first heat exchanger of this embodiment comprises a first set of channels through which the warm air $W_1$ from inside the electrical room is drawn or conducted. The second set of channels may be cooled by passing water through them. The first and second sets of channels are in thermal contact with each other, as described previously in respect of the first heat exchanger 30. This embodiment is advantageous when there is a continuous supply of cold, clean water that may be pumped through the heat exchanger 30 in order to cool the inside air $W_1$ from the electrical room.

Figure 4:
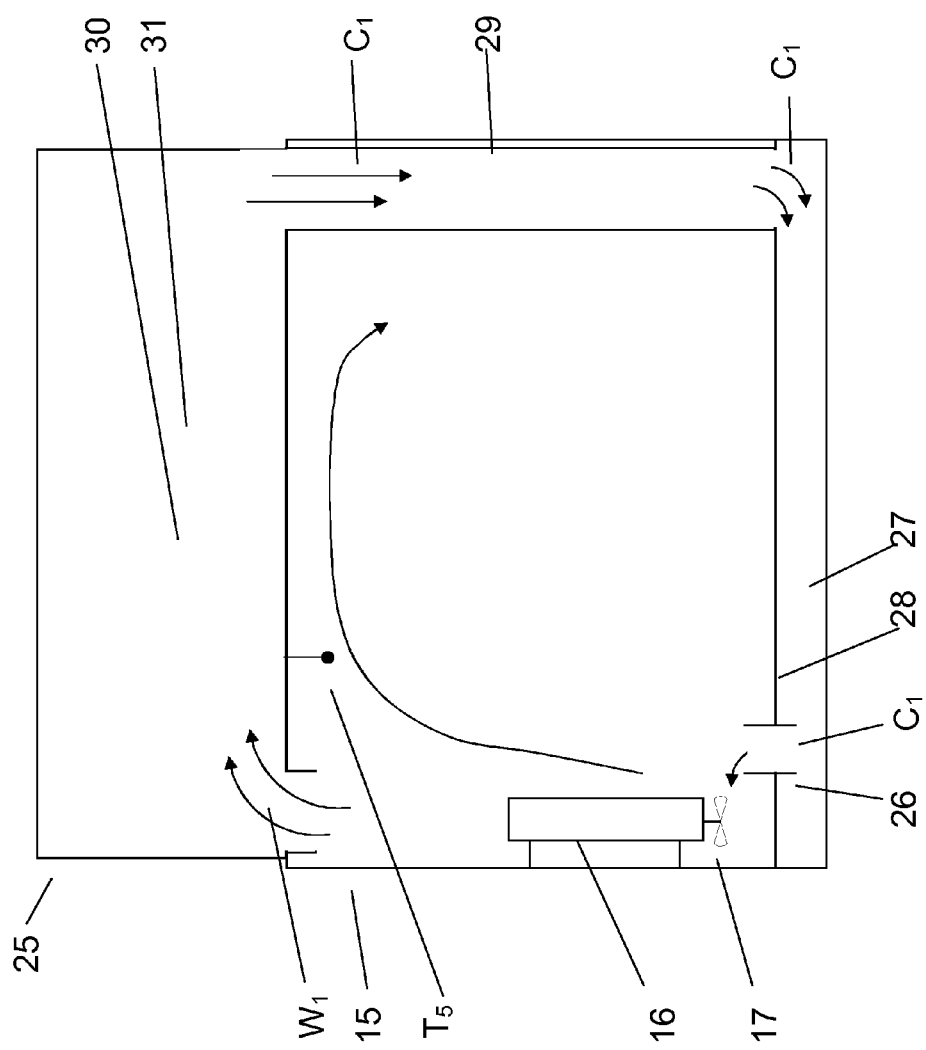
FIG. 4 shows schematically another embodiment of the invention of FIG. 1 and in particular where the cooling device is mounted on the roof of the electrical room.
Figure 5:
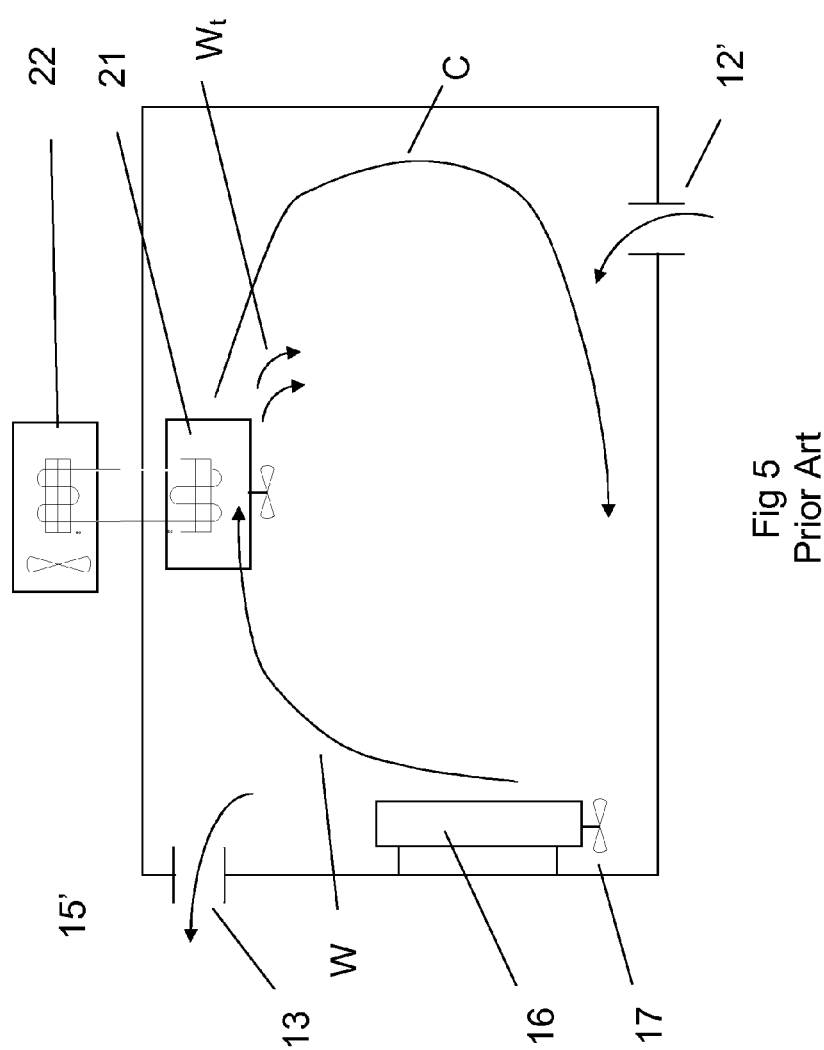
FIG. 5 (Prior Art) shows schematically a known type of cooling device for an electrical room, an arrangement often called a split air conditioner.

FIG. 4 shows another embodiment of the invention. In this embodiment the cooling device 25 is arranged in an enclosure on the roof of the electrical room. FIG. 4 shows an electrical room 15 and a cooling device 25. It also shows a flow of warm air $W_1$ rising up from the inverters, converters etc. 16 towards the ceiling of the electrical room. The warm air $W_1$ is drawn or conducted through a suitable opening in the ceiling and up into the cooling device 25 by a fan (not shown) and through the first heat exchanger 30 (not shown). Cooled air $C_1$ is conducted or blown by a fan (not shown) down and through an insulated duct 29 into an air space 27 under the insulated floor 28 of the electrical room 15. Alternatively the cooling device may be installed in a space constructed between the ceiling of the room and the external roof of the room. The advantage of this embodiment is that the cooling device 25 takes up no space inside the electrical room, and that the naturally occurring convection flows are fully utilized.

The methods for supervision of temperature may be carried out automatically by one or more or computerised processes without any need for supervision by or actions from an operator. Methods of the invention may be supervised, controlled or carried out by one or more computer programs. One or more microprocessors (or processors or computers) comprise a central processing unit CPU connected to or comprised in one or more of the above described crane control units, which processors, PLCs or computers perform the steps of the methods according to one or more aspects of the invention, as described for example with reference to the flowchart of FIG. 3. It is to be understood that the computer programs for carrying out methods according to the invention may also be run on one or more general purpose industrial microprocessors or PLCs or computers instead of one or more specially adapted computers or processors.

Figure 6:
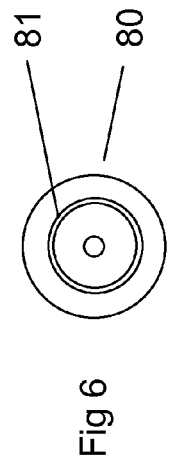
FIG. 6 schematically shows a data carrier with computer program code recorded on it for performing the steps of the method of FIG. 3 according to the second aspect of the invention.

The computer program comprises computer program code elements or software code portions that make the computer or processor perform the methods using equations, algorithms, data, stored values, calculations, synchronisations and the like for the methods previously described, and for example in relation to the flowcharts of FIG. 3, and/or to a graphic user interface showing measured temperatures in the electrical room and temperature setpoints associated with FIG. 3. A part of the program may be stored in a processor as above, but also in a ROM, RAM, PROM, EPROM or EEPROM chip or similar memory means. The or some of the programs in part or in whole may also be stored locally (or centrally) on, or in, other suitable non-transitory computer readable medium such as a magnetic disk, CD-ROM or DVD disk, hard disk, magneto-optical memory storage means, in volatile memory, in flash memory, as firmware, or stored on a data server. This computer program code may also be provided on one or more data carriers which perform the functionality of the present invention when the program code thereon is being loaded guiding server or a mobile terminal. One such data carrier 80 with computer program code 81, in the form of a CD ROM disc, is schematically shown in FIG. 6.

The embodiments illustrated and discussed in this specification are only intended to teach those skilled in the art the best way known to the inventors to make and use the invention. The person skilled in the art realizes that the present invention is by no means limited to the examples described. On the contrary, many modifications and variations are possible within the scope of the appended claims.

The invention claimed is:

1. An electrical room housing electrical and electronic apparatus for operating and controlling electrical motors of an industrial equipment, the electrical room comprising:
    a cooling device for cooling the electrical room, which the cooling device is operated dependent on at least one temperature measurement, the cooling device comprising:
        a first heat exchanger for cooling air in the electrical room, which the first heat exchanger is arranged with a first set of channels through which is conducted a first flow of air drawn from an inside of the electrical room, and
        an enclosure housing the first heat exchanger, the enclosure having an outlet for returning the first flow of air to the inside of the electrical room,
    wherein the first flow of air from inside the electrical room is circulated through the enclosure of the cooling device and returned to the electrical room in a closed loop, and wherein an air temperature in the electrical room is controlled dependent on a setpoint of between 24-40° C. for the at least one temperature measurement inside the electrical room,
    characterised in that
    the enclosure of the cooling device is arranged with at least one second heat exchanger positioned in the first flow of air from the inside of the electrical room, the at least one second heat exchanger being connected to at least one third heat exchanger arranged outside of the electrical room,
    wherein the first flow of the air passes through the first heat exchanger, the at least one second heat exchanger and the outlet of the cooling device.

2. The electrical room according to claim 1, characterised in that the first heat exchanger is an air-to-air heat exchanger arranged with a second set of channels, which the second set of channels are in thermal contact with the first set of channels arranged in the air-to-air heat exchanger, through the second set of channels is conducted a second flow of air drawn from the outside of the electrical room.

3. The electrical room according to claim 2, characterised in that the first set of channels and the second set of channels in the first heat exchanger are arranged such that the first flow of air in the first set of channels flow in the first heat exchanger is conducted in a direction counter to a direction of the second flow of air in the second set of channels.

4. The electrical room according to claim 1, characterised in that the at least one second heat exchanger comprises two or more evaporator coils each containing a heat transfer fluid and each connected to a respective one of the at least one third heat exchangers.

5. The electrical room according to claim 4, characterised in that the two or more evaporator coils comprised in the at least one second heat exchanger are each connected to the respective one of two or more third heat exchangers which are arranged with control switches such that only a selected one of the two or more evaporator coils is cooled.

6. The electrical room according to claim 1, characterised in that the cooling device is arranged connected with an insulated air collecting space into which the first flow of air from the electrical room is conducted after cooling of the first flow of air.

7. The electrical room according to claim 6, characterised in that the insulated air collecting space is arranged under a floor of the electrical room and the cooled first flow of air is maintained at an overpressure relative to an air pressure in the electrical room.

8. The electrical room according to claim 1, characterised in that the cooling device is arranged with two or more air pressurising devices for conducting the first flow of air and the second flow of air into contact with the first heat exchanger.

9. The electrical room according to claim 8, characterised in that the cooling device is arranged with control switches for controlling at least the two or more air pressurising devices and the at least one third heat exchanger so that the air temperature in the electrical room is controlled dependent on a setpoint of between 35-40° C. for the at least one temperature measurement in the electrical room.

10. The electrical room according to claim 1, characterised in that the electrical room is constructed from a shipping container or a freight container.

11. A method for cooling an electrical room housing electrical and electronic apparatus for operating and controlling electric motors of an industrial equipment, the electrical room comprising a cooling device for cooling the electrical room, which the cooling device is operated dependent on at least one temperature measurement, the cooling device comprising a first heat exchanger for cooling air in the electrical room, which the first heat exchanger is arranged with a first set of channels, and an enclosure housing the first heat exchanger, the enclosure having an outlet for returning the air to an inside of the electrical room, wherein the enclosure of the cooling device is arranged with at least one second heat exchanger, the method comprising conducting a first flow of air from the inside of the electrical room through the first heat exchanger and returning the first flow of air to the electrical room in a closed loop, and controlling an air temperature in the electrical room dependent on a setpoint of between 24-40° C. for the at least one temperature measurement inside the electrical room, characterised by further conducting the first flow of air past the at least one second heat exchanger which is connected to at least one third heat exchanger arranged outside of the electrical room, wherein the first flow of the air passes through the first heat exchanger, the at least one second heat exchanger and the outlet of the cooling device.

12. The method according to claim 11, characterised in that the first heat exchanger is an air-to-air heat exchanger arranged with a second set of channels, and characterised by conducting a second flow of air from the outside of the electrical room through the second set of channels of the first heat exchanger.

13. The method according to claim 12, characterised by conducting the first flow of air through the first set of channels and conducting the second flow of air through the second set of channels in the first heat exchanger such that the direction of the first flow of air is counter to a direction of the second flow of air.

14. The method according to claim 11, characterised by the conducting the first flow of air past two or more evaporator coils comprised in the at least one second heat exchanger and by switching on and operating a respective one of the at least one third heat exchangers to cool a heat transfer medium circulating from a selected one of the two or more evaporator coils.

15. The method according to claim 11, characterised by conducting the first flow of air past the first heat exchanger of the cooling device after cooling the air and into an insulated air collecting space in a lower part of the electrical room.

16. The method according to claim 15, characterised in that the insulated air collecting space is arranged under a floor of the electrical room, and characterised by conducting the first flow of air after cooling the first flow of air into the insulated air collecting space and maintaining the cooled air at an overpressure compared to an air pressure in a remainder of the electrical room.

17. The method according to claim 11, characterised in that the cooling device is arranged with two or more air pressurising devices and by operating the two or more air pressurising devices and so conducting the first flow of air and the second flow of air into contact with the first heat exchanger.

18. The method according to claim 17, characterised in that the cooling device is arranged with control switches for controlling at least the two or more air pressurising devices and by operating one or more control switches for controlling the at least two or more air pressurising devices and the at least one third heat exchanger and controlling the air temperature in the electrical room dependent on a setpoint of between 35-40° C. for the at least one temperature measurement in the electrical room.

19. A computer program provided on a non-transitory computer readable medium comprising computer code and/or computer software means which, when fed into a computer, will make the computer carry out a method for cooling an electrical room housing electrical and electronic apparatus for operating and controlling electric motors of an industrial equipment, the electrical room comprising a cooling device for cooling the electrical room, which the cooling device is operated dependent on at least one temperature measurement, the cooling device comprising a first heat exchanger for cooling air in the electrical room, which the first heat exchanger is arranged with a first set of channels, and an enclosure housing the first heat exchanger, the enclosure having an outlet for returning the air to an inside of the electrical room, wherein the enclosure of the cooling device is arranged with at least one second heat exchanger, the method comprising conducting a first flow of air from the inside of the electrical room through the first heat exchanger and returning the first flow of air to the electrical room in a closed loop, and controlling an air temperature in the electrical room dependent on a setpoint of between 24-40° C. for the at least one temperature measurement inside the electrical room, characterised by further conducting the first flow of air past the at least one second heat exchanger which is connected to at least one third heat exchanger arranged outside of the electrical room, wherein the first flow of the air passes through the first heat exchanger, the at least one second heat exchanger and the outlet of the cooling device.

20. A non-transitory computer readable medium comprising a computer program which when read into a computer or processor will cause the computer or processor to carry out a method for cooling an electrical room housing electrical and electronic apparatus for operating and controlling electric motors of an industrial equipment, the electrical room comprising a cooling device for cooling the electrical room, which the cooling device is operated dependent on at least one temperature measurement, the cooling device comprising a first heat exchanger for cooling air in the electrical room, which the first heat exchanger is arranged with a first set of channels, and an enclosure housing the first heat exchanger, the enclosure having an outlet for returning the air to an inside of the electrical room, wherein the enclosure of the cooling device is arranged with at least one second heat exchanger, the method comprising conducting a first flow of air from the inside of the electrical room through the first heat exchanger and returning the first flow of air to the electrical room in a closed loop, and controlling an air temperature in the electrical room dependent on a setpoint of between 24-40° C. for the at least one temperature measurement inside the electrical room, characterised by further conducting the first flow of air past the at least one second heat exchanger which is connected to at least one third heat exchanger arranged outside of the electrical room, wherein the first flow of the air passes through the first heat exchanger, the at least one second heat exchanger and the outlet of the cooling device.

21. An industrial installation comprising an electrical room housing electrical and electronic apparatus for operating and controlling electrical motors of an industrial equipment, the electrical room comprising a cooling device for cooling the electrical room, which the cooling device is operated dependent on at least one temperature measurement, the cooling device comprising:

a first heat exchanger for cooling air in the electrical room, which the first heat exchanger is arranged with a first set of channels through which is conducted a first flow of air drawn from an inside of the electrical room, and an enclosure housing the first heat exchanger, the enclosure having an outlet for returning the first flow of air to the inside of the electrical room, wherein the first flow of air from inside the electrical room is circulated through the enclosure of the cooling device and returned to the electrical room in a closed loop, and wherein an air temperature in the electrical room is controlled dependent on a setpoint of between 24-40° C. for the at least one temperature measurement inside the electrical room characterised in that the enclosure of the cooling device is arranged with at least one second heat exchanger positioned in the first flow of air from the inside of the electrical room, the at least one second heat exchanger being connected to at least one third heat exchanger arranged outside of the electrical room, wherein the first flow of the air passes through the first heat exchanger, the at least one second heat exchanger and the outlet of the cooling device.

* * * * *